United States Patent
Kamkar et al.

(10) Patent No.: US 10,418,044 B2
(45) Date of Patent: Sep. 17, 2019

(54) CONVERTING A SINGLE-BIT AUDIO STREAM TO A SINGLE-BIT AUDIO STREAM WITH A CONSTANT EDGE RATE

(71) Applicant: Cirrus Logic International Semiconductor Ltd., Edinburgh (GB)

(72) Inventors: Shafagh Kamkar, Austin, TX (US); Dylan Hester, Austin, TX (US); Bruce Duewer, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/706,160

(22) Filed: Sep. 15, 2017

(65) Prior Publication Data
US 2018/0218745 A1 Aug. 2, 2018

Related U.S. Application Data

(60) Provisional application No. 62/451,972, filed on Jan. 30, 2017, provisional application No. 62/461,389, filed on Feb. 21, 2017.

(51) Int. Cl.
*G10L 21/0316* (2013.01)
*G10L 19/16* (2013.01)
(Continued)

(52) U.S. Cl.
CPC ............ *G10L 19/167* (2013.01); *G06F 3/165* (2013.01); *G10L 19/0212* (2013.01);
(Continued)

(58) Field of Classification Search
CPC . G10L 19/0017; G10L 19/002; G10L 19/032; G10L 21/0316; H03M 3/50;
(Continued)

(56) References Cited

U.S. PATENT DOCUMENTS 4,683,458 A * 7/1987 Hallgren ............. H03M 1/0682
341/127
5,815,102 A * 9/1998 Melanson ............... G06F 1/025
341/143
(Continued)

FOREIGN PATENT DOCUMENTS

| CN | 101335501 A | 12/2008 |
| EP | 1403853 A1 | 3/2004 |

(Continued)

OTHER PUBLICATIONS

Anonymous: "Direct Stream Digital", Wikipedia, Jan. 5, 2017, XP055462940: https://en.wikipedia.org/w/index.php?title+Direct_Stream_Digital&oldid=758469090.

*Primary Examiner* — Martin Lerner
(74) *Attorney, Agent, or Firm* — Norton Rose Fulbright US LLP

(57) ABSTRACT

A single-bit audio stream can be converted to a modified single-bit audio stream with a constant edge rate while maintaining a modulation index of the original audio stream using direct mapping. With direct mapping, a pre-filter bank may be combined with a multi-bit symbol mapper to select symbols for the modified audio stream with a constant edge rate per symbol and the same modulation index as the original audio stream. The output of the pre-filter bank may be an audio stream with no consecutive full-scale symbols. Using the output of the pre-filter bank, a multi-bit symbol mapper may use the symbol selector to output a symbol with a constant edge rate per symbol and the same modulation index as the original signal. The symbols may be converted to an analog signal for reproduction of audio content using a transducer.

14 Claims, 7 Drawing Sheets

(51) Int. Cl.
*G06F 3/16* (2006.01)
*G10L 19/02* (2013.01)
*G10L 19/032* (2013.01)
*G10L 19/26* (2013.01)
*H03M 5/08* (2006.01)
*H03M 5/14* (2006.01)
*H03M 5/04* (2006.01)

(52) U.S. Cl.
CPC ............ *G10L 19/032* (2013.01); *G10L 19/26* (2013.01); *H03M 5/08* (2013.01); *H03M 5/14* (2013.01)

(58) Field of Classification Search
CPC .. H03M 3/502; H03M 7/3004; H03M 7/3006; H03M 7/3028
USPC ................. 704/225, 230, 500; 341/127, 143
See application file for complete search history.

(56) References Cited

U.S. PATENT DOCUMENTS

| | | | |
|---|---|---|---|
| 6,005,506 A * | 12/1999 | Bazarjani | H03D 3/007 341/143 |
| 6,150,969 A * | 11/2000 | Melanson | G06F 1/025 341/143 |
| 6,608,572 B1 * | 8/2003 | Venkitachalam | H03H 17/0614 341/143 |
| 6,727,832 B1 | 4/2004 | Melanson | |
| 6,803,869 B1 | 10/2004 | Melanson et al. | |
| 6,885,320 B2 * | 4/2005 | Kim | H03M 7/40 341/50 |
| 6,940,437 B2 * | 9/2005 | Trotter | H03M 7/3011 341/143 |
| 7,167,118 B1 * | 1/2007 | Melanson | H03M 3/506 341/143 |
| 7,183,954 B1 | 2/2007 | Melanson et al. | |
| 7,327,295 B1 * | 2/2008 | Trotter | H03K 7/08 341/143 |
| 2003/0122692 A1 | 7/2003 | Roeckner et al. | |
| 2004/0189503 A1 * | 9/2004 | Melanson | H03M 3/372 341/152 |
| 2005/0093727 A1 * | 5/2005 | Trotter | H03M 7/3011 341/143 |
| 2008/0052304 A1 * | 2/2008 | Raghunandan | H04L 45/00 |
| 2010/0329482 A1 | 12/2010 | Lee | |
| 2012/0139768 A1 | 6/2012 | Loeda et al. | |
| 2016/0291935 A1 * | 10/2016 | Straeussnigg | G06F 7/582 |
| 2016/0309274 A1 | 10/2016 | Ma et al. | |
| 2016/0358617 A1 * | 12/2016 | Lesso | G10L 19/167 |
| 2018/0217807 A1 * | 8/2018 | Duewer | H03M 5/14 |

FOREIGN PATENT DOCUMENTS

| | | |
|---|---|---|
| EP | 2461485 A1 | 6/2012 |
| EP | 2843841 A1 | 3/2015 |
| GB | 2499699 A | 8/2013 |
| GB | 2531824 A | 5/2016 |
| WO | 1992/22140 A1 | 12/1992 |

* cited by examiner

CONVERTING A SINGLE-BIT AUDIO STREAM TO A SINGLE-BIT AUDIO STREAM WITH A CONSTANT EDGE RATE

CROSS-REFERENCE TO RELATED PATENT APPLICATIONS

This application claims the benefit of priority of U.S. Provisional Patent Application No. 62/451,972 to Shafagh Kamkar filed on Jan. 30, 2017, and entitled "PDM to PWM Direct Mapping" and claims the benefit of priority of U.S. Provisional Patent Application No. 62/461,389 to Bruce Duewer filed on Feb. 21, 2017, and entitled "Single-Bit Volume Control," both of which are hereby incorporated by reference. This application is related by subject matter to U.S. patent application Ser. No. 15/706,215 to Bruce Duewer filed on Sep. 15, 2017, and entitled "Single-Bit Volume Control."

FIELD OF THE DISCLOSURE

The instant disclosure relates to audio processing. More specifically, portions of this disclosure relate to processing single-bit audio streams.

BACKGROUND

Single-bit audio streams can be advantageous over multi-bit audio streams as being simpler in concept and execution. Single-bit audio streams are frequently used for conveying high definition audio. For example, the pulse density modulation (PDM) is used for high-quality audio in the Super Audio CD (SACD) format. However, single-bit audio streams, such as PDM, can have a data-dependent edge rate that produces undesirable playback artifacts. Edge rate refers to the rate of transitions of the audio stream from a '1' to a '0.' An audio stream with a data-dependent edge rate has an undetermined timing of transitions from a '1' to a '0.' The data-dependent edge rate artifacts can include inter-symbol interference in current-steering digital analog converters (DACs), resulting in poor total harmonic distortion and noise (THD+N). Current-steering DACs are common components for reproducing audio in mobile phones and other audio devices. Thus, it is desirable to convert a single-bit audio stream with a data-dependent edge rate to a single-bit audio stream with a constant edge rate. An audio stream with a constant edge rate has a transition from a '1' to a '0' within determined times.

One conventional solution for obtaining a constant edge rate audio stream from a PDM audio stream uses a return-to-zero (RTZ) format and is shown in FIG. 1. A system 100 upsamples a single-bit audio signal at block 102. The upsampled signal includes multiple copies of each bit of the single-bit audio signal at a higher data rate than the signal-bit audio signal, such that the upsampled audio signal has redundant information. RTZ block 104 receives the upsampled audio signal and inserts a gap between symbols (groups of bits) to obtain at least one up ('0' to '1') and one down ('1' to '0') transition in every symbol. However, with a current-steering DAC, each bit of the modified single-bit audio signal controls the addition of current to the output of the DAC. The insertion of the gap in RTZ block 104 changes the analog output generated from the modified single-bit audio signal and attenuates the signal. This introduces undesirable noise in the reproduction of audio in the single-bit audio stream. Furthermore, the introduction of the gap undesirably changes the modulation index of the audio stream.

Still further, there is limited control over the volume of the audio signal being reproduced from the single-bit audio stream or the modified single-bit audio stream. Conventionally a modulator is used for volume control on digital signals. However, modulators affect the quality of the reproduced audio.

Shortcomings mentioned here are only representative and are included simply to highlight that a need exists for improved electrical components, particularly for audio devices employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

A single-bit audio stream can be converted to a modified single-bit audio stream with a constant edge rate while maintaining a modulation index of the original audio stream using direct mapping. With direct mapping, a pre-filter bank may be combined with a multi-bit symbol mapper to select symbols for the modified audio stream with a constant edge rate per symbol and the same modulation index as the original audio stream. The pre-filter bank may include one or more filters that implement a multi-bit symbol selector, a filter for out-of-band noise of the original audio stream, a filter for quantization noise of the original audio stream, and/or magnitude compensation for a frequency response of the audio system. Using the output of the pre-filter bank, a multi-bit symbol mapper may produce a selected symbol to output an audio stream with a constant edge rate per symbol and the same modulation index as the original signal. The output of the direct mapper may be an audio stream with no consecutive full-scale symbols.

The direct mapping may be used to convert a single-bit audio stream, such as a pulse density modulation (PDM) audio stream, to a single-bit pulse width modulation (PWM) output. That output may be conveyed to other circuitry for processing and/or for reproducing the audio content of the original audio stream. For example, a digital-to-analog converter (DAC) may generate an analog signal based on the converted single-bit audio stream corresponding to audio content in the original audio stream. The output of the DAC may be conveyed to an amplifier for reproducing sounds on a transducer, such as a speaker, microspeaker, or headphones of a mobile device.

Volume control may be implemented in one or more stages of an audio controller for playback a single-bit audio stream. For example, with direct mapping the selection of multi-bit symbols for each bit of the original audio stream may be based on a desired volume. Multi-bit symbols with greater difference between their ones density and zeroes density have a higher current output when input to a current-steering DAC, and thus a higher volume. Volume control may additionally or alternatively be implemented in a current-to-voltage converter downstream from the current-steering DAC. For example, the current-to-voltage converter may include an attenuator controlled based on the desired volume level.

In some embodiments, voltage control may be performed in two stages, such as with a first control in digital circuitry prior to DAC conversion in the direct mapper and with a second control in analog circuitry after the DAC conversion in the current-to-voltage converter. The coarse control obtained in the digital circuitry by selecting symbol mappings may be limited by the clock rate difference between the original audio stream and the converted audio stream. Where the coarse control in the digital circuitry is insufficient, volume control in the analog circuitry may provide better volume control. Because coarse volume control is performed in the digital stage, the dynamic range (DR) of the analog circuitry for volume control may be reduced. This reduces the size and cost of the analog circuitry volume control. Thus, the combination of analog and digital volume control provides improved volume control while avoiding the drawbacks of an analog-only or digital-only volume control.

With two stages, a coarse and fine volume control may be implemented to obtain a desired volume. The fine control attenuator in the current-to-voltage converter may apply attenuations of 0 decibels (dB), −1 dB, −2 dB, −3 dB, −4 dB, −5 dB, and the like. The coarse control in the symbol selector may apply attenuations of 0 dB, −6 dB, and/or mute. The combination of such coarse and fine volume control may allow combined volume controls from 0 dB to −11 dB and Mute in 1 dB increments.

Electronic devices incorporating the audio processing described above may benefit from improved sound quality, improved dynamic range, reduced manufacturing cost, and/or reduced size. Integrated circuits of the electronic devices may include an audio controller with the described functionality. Such an audio controller may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Audio quality while playing a single-bit audio stream can be improved by modifying the single-bit audio stream to have a constant edge rate while preserving a modulation index of the audio stream. Modifying an audio stream to have a constant edge rate with the same modulation index improves playback, particularly in devices using current-steering digital-to-analog converters (DACs) such as mobile phones. Playback of a single-bit audio stream, such as a pulse density modulation (PDM) encoded high quality audio file, is illustrated in FIG. 2.

Figure 1:
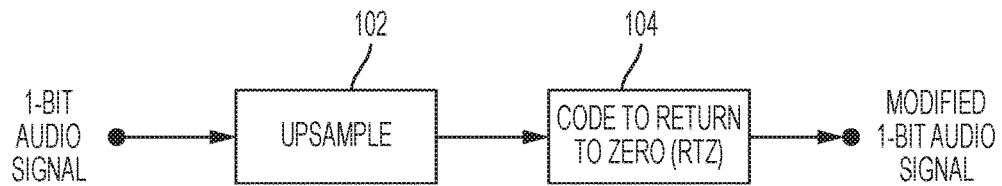
FIG. 1 is a block diagram representation illustrating a circuit for modifying an audio signal according to the prior art.
Figure 2:
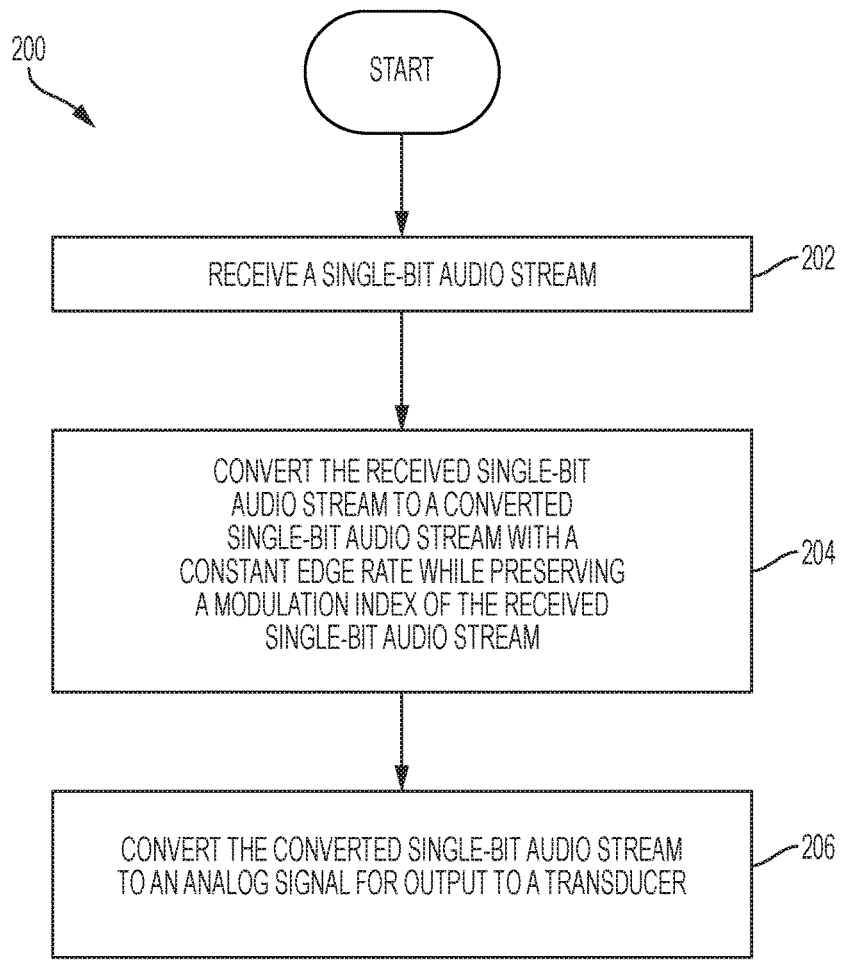
FIG. 2 is a flow chart illustrating an example method for modifying an audio signal according to some embodiments of the disclosure.

FIG. 2 is a flow chart illustrating an example method for modifying an audio signal according to some embodiments of the disclosure. A method 200 for playing back a single-bit audio stream begins at block 202 with receiving the original single-bit audio stream. At block 204, the original audio stream is converted into a converted single-bit audio stream with a constant edge rate without reducing available full-scale output level of the received single-bit audio stream. The available full-scale output level may be maintained with an appropriate mapping from the single-bit audio stream to multi-bit symbols. In some embodiments, a modulation index of the original audio stream is preserved in the converted audio stream, and a selected modulation index for the converted audio stream can be as high as the modulation index of the original single-bit audio stream. The converted audio stream has an equivalent audio content as the original audio stream in that audio content is preserved such that it sounds the same to a listener when reproduced through a transducer. For example, the converted audio stream may include a series of symbols without consecutive full-scale symbols, yet the audio content is preserved such that a listener would not distinguish between playback of the original data stream or the converted data stream. However, in some embodiments the modulation index of the original audio stream may be modified. One example modification of the modulation index may be to set a given maximum volume level at the output in conjunction with a given implementation of block 206 and available supply level. Another example modification of the modulation index is to perform digital volume control as described herein. At block 206, the converted single-bit audio stream is converted to an analog signal for output to a transducer.

Figure 3:
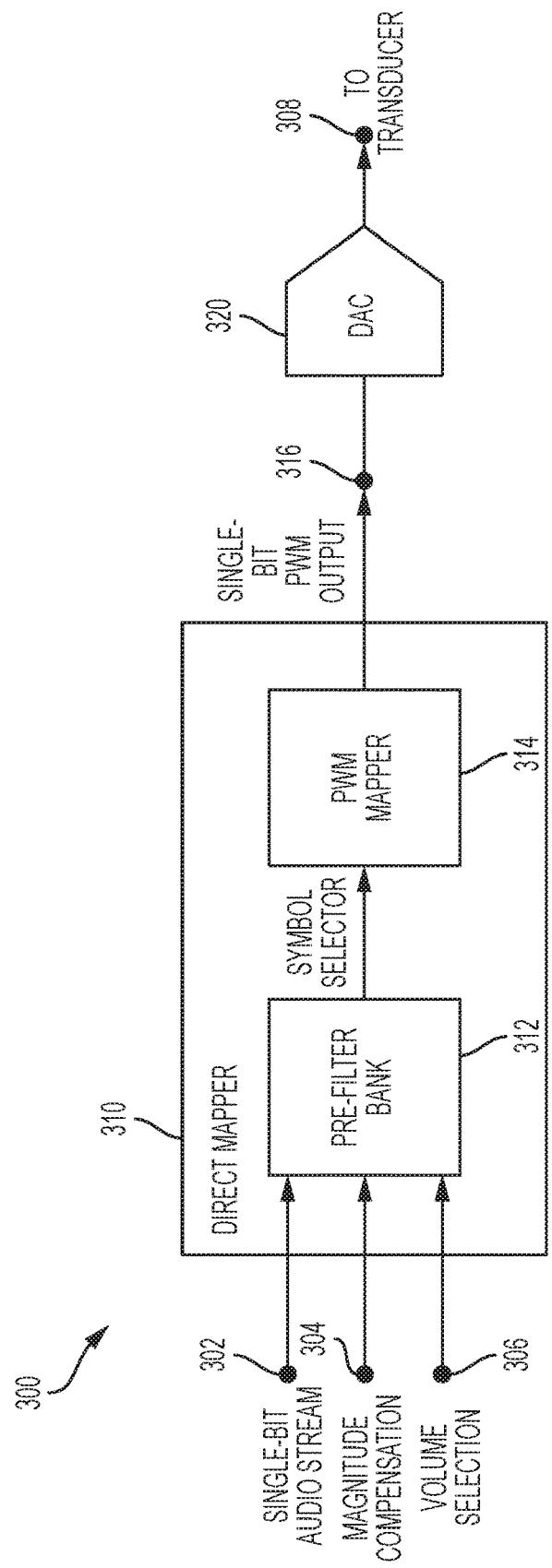
FIG. 3 is a block diagram representation illustrating a circuit for direct mapping a single-bit audio stream to a PWM output according to some embodiments of the disclosure.

Conversion of the single-bit audio stream may be performed with a direct mapper that outputs a single-bit PWM output comprising multi-bit symbols selected based, in part, on the original audio stream such that the audio content in the original audio stream is preserved. One embodiment of a circuit for conversion using a direct mapper is shown in FIG. 3. FIG. 3 is a block diagram representation illustrating a circuit for direct mapping a single-bit audio stream to a PWM output according to some embodiments of the disclosure. A circuit 300 includes a direct mapper 310 coupled to a digital-to-analog converter (DAC) 320. The direct mapper 310 receives a single-bit audio stream for conversion at input node 302. The direct mapper 310 may also receive other input signals that control the conversion of the audio stream. For example, the direct mapper 310 may receive a magnitude compensation indication at input node 304 and/or a volume selection indication at input node 306. The magnitude compensation indication may control application of magnitude compensation within the pre-filter bank that masks a non-flat frequency response. The volume control indication may control a volume of audio reproduced by the transducer. Each of the inputs 302, 304, and/or 306 may control the selection of symbols for output from the PWM mapper 314. In one embodiment, the PWM mapper 314 may implement a look-up table with a number of dimensions determined by the number of criteria used to select symbols. The direct mapper 310 outputs a converted single-bit audio stream at output node 316. The converted single-bit audio stream includes equivalent audio content, but modified to have a constant edge rate with the same modulation index. That audio stream may be output to a transducer playback path at node 308 after conversion to an analog signal at block 320.

In one embodiment of direct mapper 310, the direct mapper 310 may include a pre-filter bank 312 and a PWM mapper 314. The pre-filter bank 312 may include a plurality of low-pass filters that implement a multi-bit symbol selector, a filter for out-of-band noise, a filter for quantization noise, a volume control, and/or magnitude compensation. The output of the pre-filter bank 312 is a symbol selector, which may be interpreted by PWM mapper 314 to select a multi-bit symbol for output as the converted single-bit audio stream. The symbol selection performed by the pre-filter bank 312 may be configured to select a symbol from the PWM mapper 314 such that the audio stream at output node 316 has a constant edge rate per symbol and the same modulation index as the original audio stream received at input node 302. When a constant edge rate per symbol is achieved, the converted audio stream may have few or no consecutive full-scale symbols at output node 316. The pre-filter bank 312 achieves this by inserting 0's without using a modulator that would otherwise decrease sound quality.

The likelihood of consecutive full-scale symbols may be reduced by selecting an appropriate window size for the pre-filter bank 312. A constant edge rate may be achieved by screening the original audio stream in a long enough window of time such that no two full-scale symbols are selected consecutively. Thus, the pre-filter bank 312 may have a number of taps selected such that there are enough taps to avoid two consecutive full-scale symbols at a designed modulation index. A modulation index is calculated as $(28-2N)/28$ and N is the number of 1's in a 28-bit window. A Direct Stream Digital (DSD) signal for a 0 dB Super Audio Compact Disc (SACD) may have a modulation index of 50% with on average six 1's in an 8-bit wide window. A DSD signal for a +3 dB SACD may have a modulation index of 71% with on average 7 1's in an 8-bit wide window. A pre-filter bank 312 with a seventh-order FIR filter has an 8-bit wide window and may sufficiently reduce the likelihood of consecutive full-scale symbols. A longer window for the pre-filter bank 312 may be chosen to guarantee that no consecutive two-full scale symbols are selected. For a DSD signal with a 71% modulation index, a window of 24 bits can guarantee no consecutive full-scale symbols. At a 71% modulation index, there are 24 1's and 4 0's in a 28-bit window, guaranteeing that every 24 bits of consecutive 1's will be followed by 4 bits of 0's.

One method of configuring the pre-filter bank 312 to select symbols to achieve non-consecutive full-scale symbols is to select symbols such that a gap of 0's separates symbols. For example, symbols are selected such that when a full-scale symbol is used, a previous symbol will end in zero and the next symbol will begin with a 0. Thus, a full-scale symbol is always surrounded by 0's in neighboring symbols, such as in the audio stream of "1111-1110/1111-1111/0111-1111," where the slashes indicate symbol boundaries. As another example, symmetric symbols starting and ending with 0's can be used except for full-scale symbols, which will be all 1's. These example symbol selection schemes achieve a constant edge rate while preserving the modulation index.

A direct mapper as illustrated in FIG. 3 has a symbol width bounded by the ratio of the clock rate of the input audio stream to the clock rate of the converted audio stream. If the converted audio stream has a clock rate four times faster than the input audio stream, then the symbol width is bounded by a 4-bit width. The width of the symbols on the converted audio stream may be increased by increasing the clock rate of the converted audio stream. Another technique to increase the symbol width is with the use of a polyphase filter to output a plurality of converted audio streams to a plurality of analog finite impulse response (FIR) filters of a digital-to-analog converter. In one embodiment of the direct mapper 310, the mapper 310 may include a pre-filter bank, a PWM mapper, and a polyphase filter bank. One embodiment of a direct mapper with polyphase filter bank is shown in FIG. 4.

Figure 4:
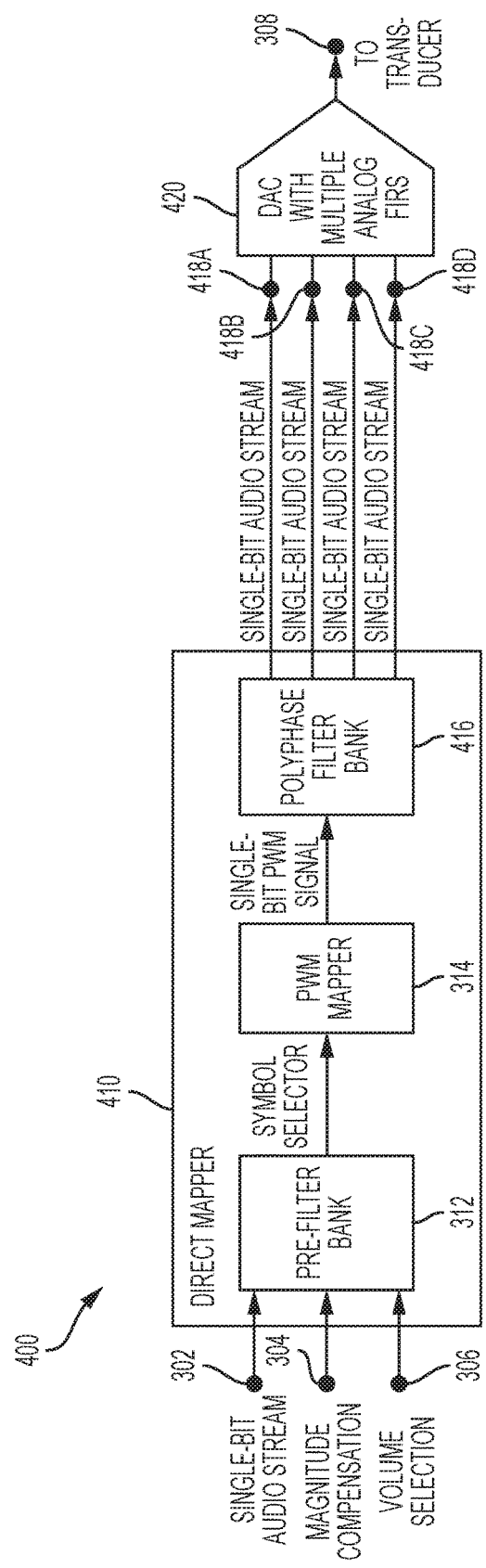
FIG. 4 is a block diagram representation illustrating a circuit for direct mapping a single-bit audio stream to a PWM output according to some embodiments of the disclosure.

FIG. 4 is a block diagram representation illustrating a circuit for direct mapping a single-bit audio stream to a PWM output according to some embodiments of the disclosure. A direct mapper 410 may receive the input audio stream at input node 302 and output a plurality of converted single-bit audio streams at output nodes 418A-D. The converted audio streams are converted into an analog signal at output node 308 by a digital-to-analog converter (DAC) 420 based on the converted audio streams. The direct mapper 410 includes a pre-filter bank 312 configured to select symbols and a PWM mapper 314 configured to output the selected symbols as a single-bit PWM signal. A polyphase filter bank 416 receives the output symbols and produces the converted audio streams at nodes 418A-D. Although four outputs are shown from the polyphase filter bank 416, more or less outputs may be produced by the polyphase filter bank 416. Each additional output effectively increases the width of the symbols output by the direct mapper 410 without changing a clock rate at the output of the mapper 410. For example, with four outputs from polyphase filter bank 416 and an output clock rate four times that of the input clock rate, a 16-bit symbol width is possible, as compared to a 4-bit symbol width for the same clock rates without the polyphase filter bank 416. The polyphase filter bank 416 allows multiple symbol selections to be processed simultaneously and thus achieve additional oversampling of the audio stream.

Figure 5:
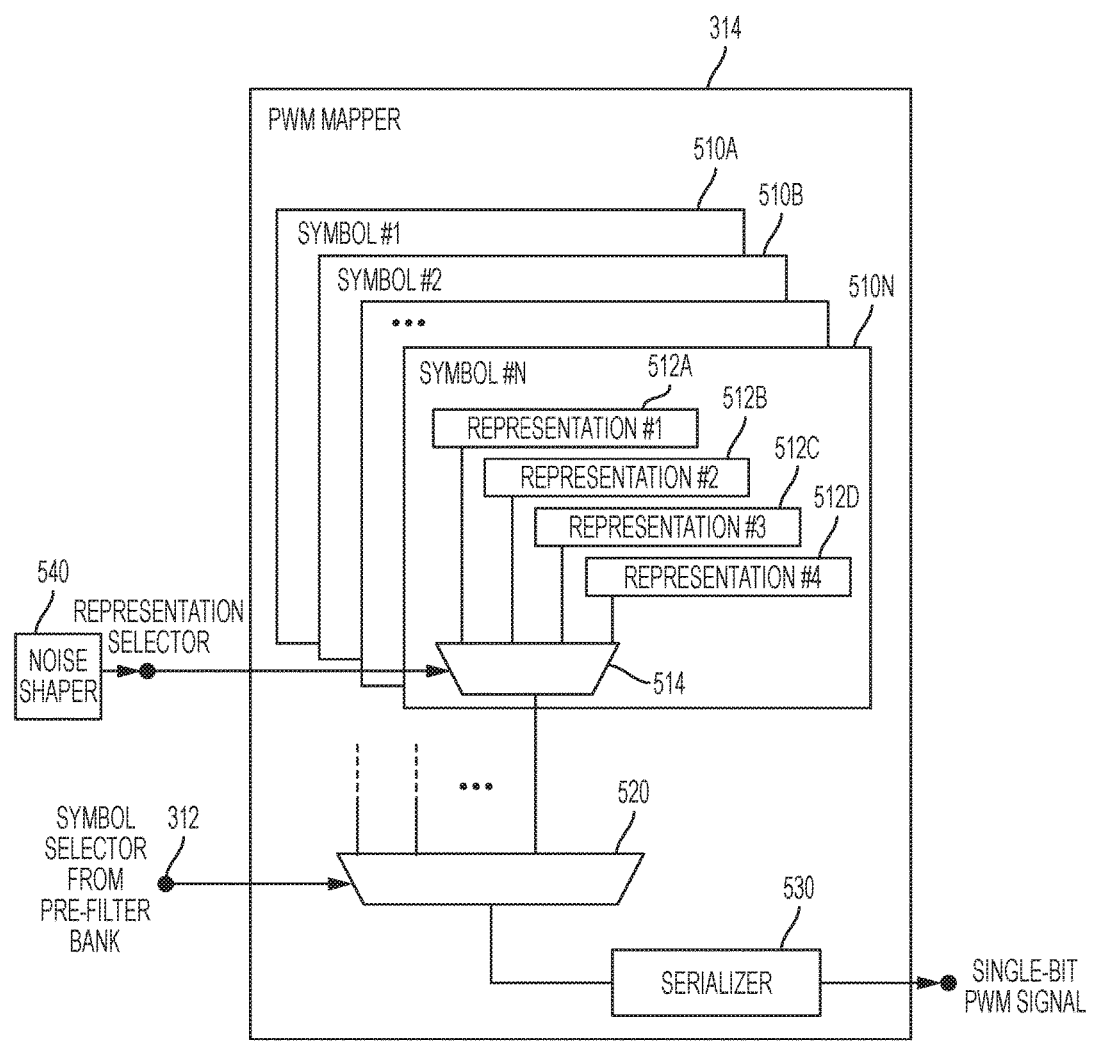
FIG. 5 is a block diagram representation illustrating a circuit for selecting symbols based on noise shaping according to some embodiments of the disclosure.

A PWM mapper 314 may have multiple representations for any selected symbol. A representation may be selected for an indicated symbol based on one or more criteria. In one embodiment, a representation is selected based, in part, on a noise shaping algorithm as shown in FIG. 5. FIG. 5 is a block diagram representation illustrating a circuit for selecting symbols based on noise shaping according to some embodiments of the disclosure. PWM mapper 314 may receive an indication of a symbol selection from pre-filter bank 312, which controls mux 520 to select an output from one of several symbol banks 510A-N. Each of the symbol banks 510A-N correspond to a different symbol that may be selected by the pre-filter bank 312 to correspond to a bit of the original single-bit audio stream. The PWM mapper 314 may have multiple representations 512A-D available for each symbol 510A-N. For example, a particular symbol may be represented as "0111-1110" or "1111-1100" or "0011-1111" or "1000-0001." A noise shaper 540 may keep track of which representation to use for each symbol to mitigate distortion. One example noise shaping algorithm for implementation in noise shaper 540 is described in U.S. Pat. No. 6,885,320, which is hereby incorporated by reference. Noise shaping to select between several possible representations is particularly useful in a feed-forward-only path, such as the circuits represented in FIG. 3 and FIG. 4. The noise shaper controls mux 514 to select one of the representations 512A-D. The selected representation is passed through the mux 520 to serializer 530, which converts the multi-bit PWM symbol to a single-bit PWM signal.

Figure 6:
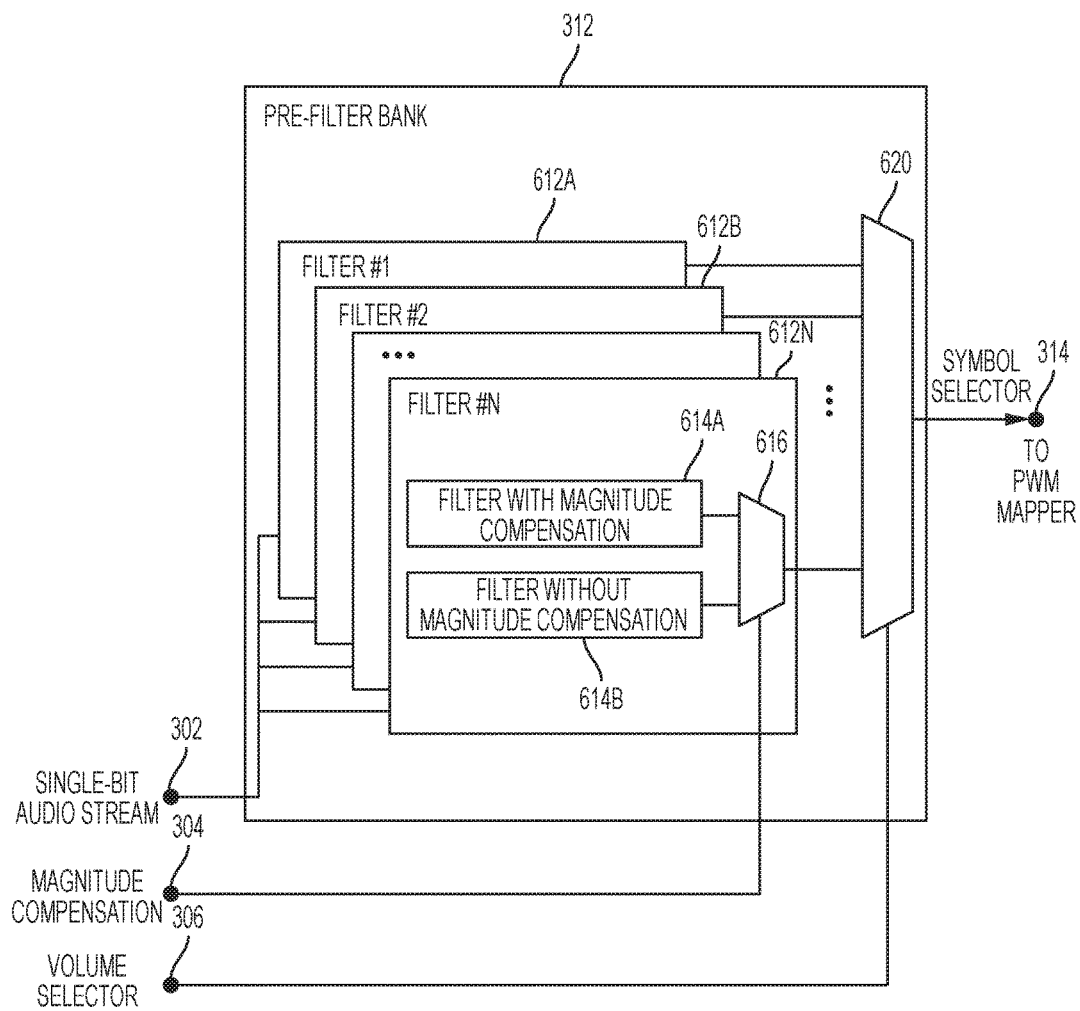
FIG. 6 is a block diagram representation illustrating a filter bank with magnitude compensation for direct mapping according to some embodiments of the disclosure.

The input to the PWM mapper 314 is a symbol selector indication generated by the pre-filter bank 312. The pre-filter bank 312 may select symbols to represent the original single-bit audio stream based on criteria including desired volume level indicated by a volume selector indicator and/or a magnitude compensation indicator. An example configuration of a pre-bank filter 312 to generate a symbol selection is shown in FIG. 6. FIG. 6 is a block diagram representation illustrating a filter bank with magnitude compensation for direct mapping according to some embodiments of the disclosure. The pre-filter bank 312 includes a plurality of filters 612A-N. Each of the filters 612A-N receives the single-bit audio stream. An output of each of the filters 612A-N is selected using mux 616 by the magnitude compensation indicator. The mux 616 selects an output from either filter 614A with magnitude compensation or filter 614B without magnitude compensation. A mux 620 selects an output from one of the filters 612A-N based on a volume selector indication. The symbol selector sent to the PWM mapper 314 from the pre-filter bank 312 is selected based on the single-bit audio stream, an indication to apply or not apply magnitude compensation, and an indication of desired volume level. The symbol selector may be based on additional or fewer criteria by adjusting the configuration of the pre-filter bank 312.

Figure 7:
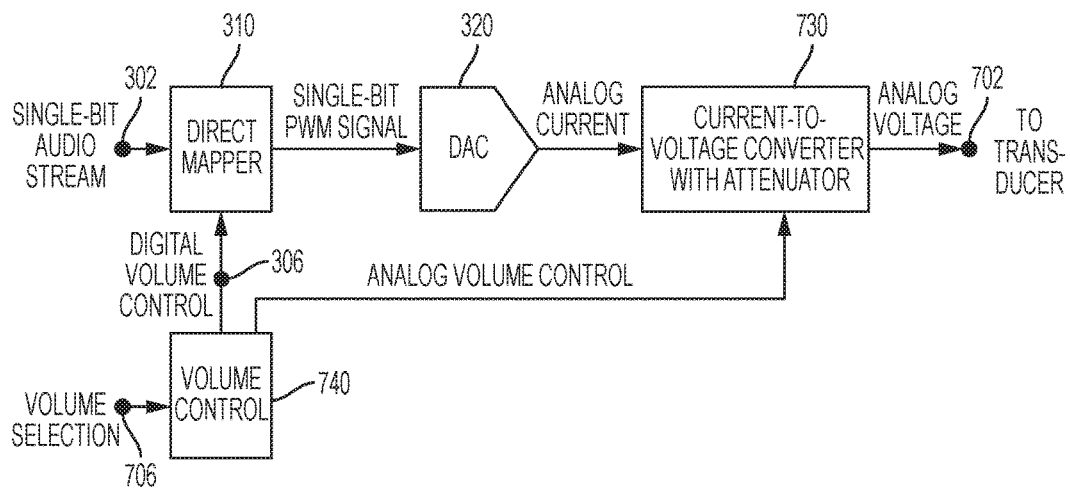
FIG. 7 is a block diagram representation illustrating two-stage volume control in an audio processing circuit according to some embodiments of the disclosure.

Volume control may additionally or alternatively be implemented in analog circuitry processing the converted single-bit audio stream. In some embodiments, two-stage volume control may be implemented using a digital volume control and an analog volume control. FIG. 7 is a block diagram representation illustrating two-stage volume control in an audio processing circuit according to some embodiments of the disclosure. A direct mapper 310, such as of the embodiments illustrated in FIG. 3 or FIG. 4, converts a single-bit audio stream received at input node 302 to a single-bit PWM signal for driving DAC 320. The DAC 320 produces an analog current based on the symbols selected by the direct mapper 310. A current-to-voltage converter 730 converts the analog current to an analog voltage for driving a transducer at output node 702. A volume control 740 receives a volume selection indicating a desired volume level. The volume control 740 determines a combination of digital volume control and analog volume control to achieve the desired volume level. The volume control 740 controls a pre-filter bank of the direct mapper 310 and an attenuator of the current-to-voltage converter 730 to output the audio content of the single-bit audio stream at the transducer. The direct mapper 310 may implement a digital gain circuit by using a symbol look-up table with different digital gains. In some embodiments, the look-up table may be arranged to provide a narrower range of edge locations for higher attenuations. For example, when selecting a 16-bit attenuated code with a 43.75% and 56.25% ones density, a choice of 0000_1111_1110_000 and 0000_1111_1111_1000 will restrict edge locations variation from symbol to symbol to a narrow range, but a choice of 0111_1111_0000_0000 and 0000_0011_1111_1110 would have a large range of possible edge locations from symbol to symbol. In some embodiments, the look-up table may have a plurality of symbols to select from which a maximum 1's density of the symbols corresponds to the desired volume level. Thus, as the digital volume control is reduced, symbols with lower 1's density are chosen for output to the DAC 320. The current-to-voltage converter 730 implements an analog gain circuit that receives the analog current from the DAC 320, generates an analog voltage corresponding to the selected symbol, and attenuates the analog voltage based on the analog volume control. In some embodiments, the digital volume control of the digital gain circuit is used to obtain coarse control over a volume level and the analog volume control of the analog gain circuit is used to obtain fine control over a volume level.

Figure 8:
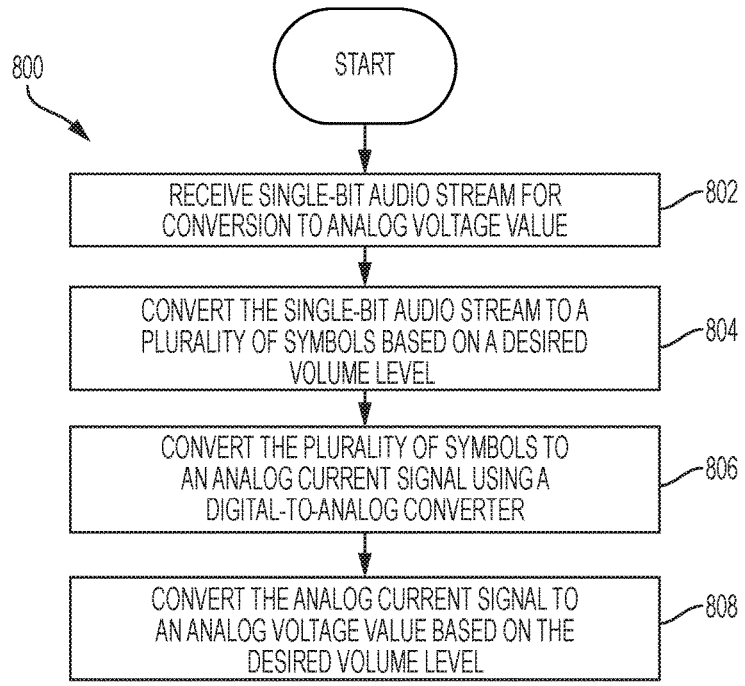
FIG. 8 is a flow chart illustrating an example method for volume control in an audio processing circuit according to some embodiments of the disclosure.

A method for performing two-stage volume control is shown in FIG. 8. FIG. 8 is a flow chart illustrating an example method for volume control in an audio processing circuit according to some embodiments of the disclosure. A method 800 begins at block 802 with receiving a single-bit audio stream for reproduction at a transducer using an analog voltage value. At block 804, the single-bit audio stream is converted to a plurality of symbols based on a desired volume level by, for example, limiting a ones density of the symbols proportionately to the desired volume level. At block 806, the plurality of symbols is converted to an analog current signal using a digital-to-analog converter (DAC). At block 808, the analog current signal is converted to an analog voltage value based on the desired volume level using, for example, an attenuator. Two-stage volume control in some embodiments can be obtained without an additional delta-sigma modulator that would reduce the purity of reproduction from single-bit audio streams and avoids additional quantization error injection. Two-stage volume control with a combination of digital and analog control can be implemented in circuitry with less area and cost than a pure analog solution. Furthermore, the use of digital volume control in the mapper can allow an improved dynamic range when symbol mappings are appropriately selected.

The volume control method 800 may be implemented in any mixed signal circuit, including a mixed signal circuit including a processor such as a digital signal processor (DSP). For example, the single-bit audio stream may be received, processed, and converted to symbols by a digital signal processor (DSP). The output of the DSP may be provided to a DAC for conversion to analog signals, which are then processed for output to a transducer. The DSP and the DAC may be coupled in an integrated circuit (IC). The IC may be packaged and incorporated into consumer electronic devices, such as mobile phones.

Figure 9:
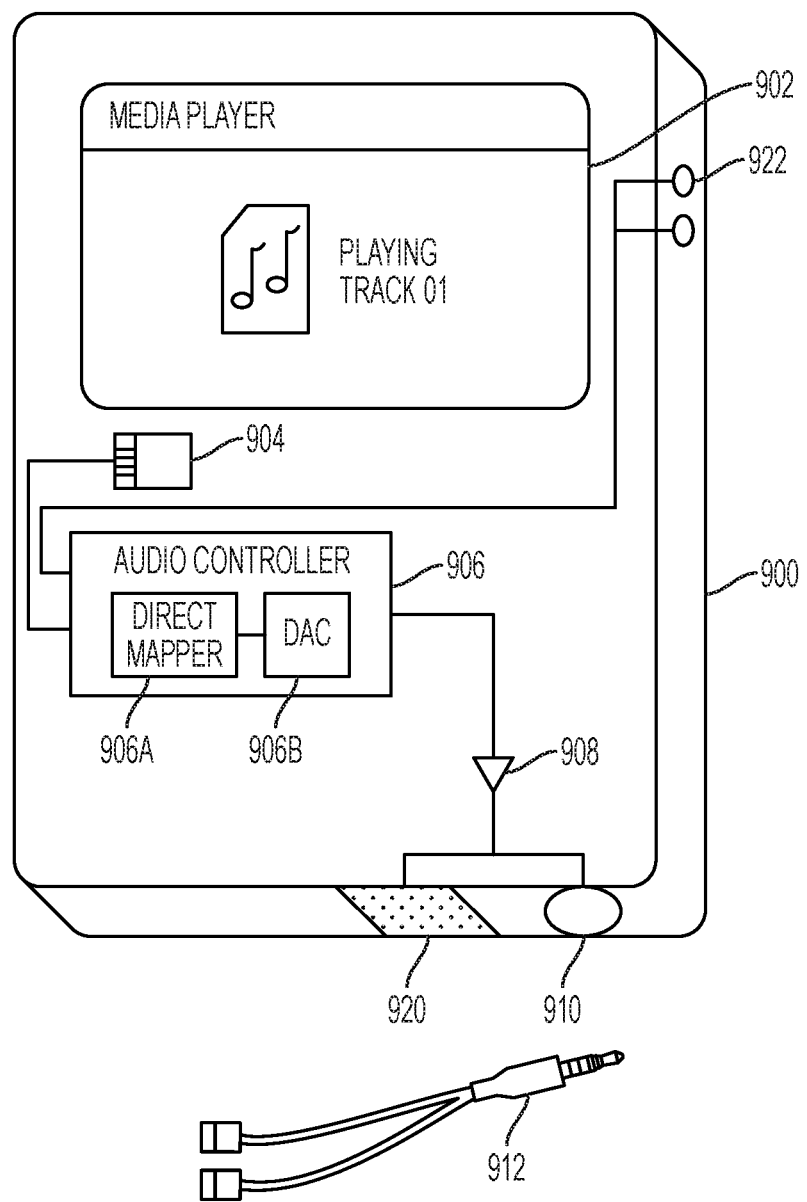
FIG. 9 is an illustration showing an example personal media device for audio playback including an audio controller that is configured to reproduce single-bit audio according to one embodiment of the disclosure.

One advantageous embodiment for an audio processor described herein is a personal media device for playing back music, high-fidelity music, and/or speech from telephone calls. FIG. 9 is an illustration showing an example personal media device for audio playback including an audio controller that is configured to reproduce audio according to one embodiment of the disclosure. A personal media device 900 may include a display 902 for allowing a user to select from music files for playback, which may include both high-fidelity music files and normal music files. When music files are selected by a user, audio files may be retrieved from memory 904 by an application processor (not shown) and provided to an audio controller 906. The audio controller 906 may include a direct mapper 906A for mapping the single-bit audio stream to PWM symbols for conversion by DAC 906B. The digital audio (e.g., music or speech) may be converted to analog signals by the audio controller 906, and those analog signals amplified by an amplifier 908. The audio controller 906 may also implement volume control using user input received from volume rocker 922 or user input to the display 902 to indicate a desired volume level. The desired volume level may be used to control symbol selection in the direct mapper 906A or attenuation in the DAC 906B. The amplifier 908 may be coupled to an audio output 910, such as a headphone jack, for driving a transducer, such as headphones 912. The amplifier 908 may also be coupled to an internal speaker 920 of the device 900. Although the data received at the audio controller 906 is described as received from memory 904, the audio data may also be received from other sources, such as a USB connection, a device connected through Wi-Fi to the personal media device 900, a cellular radio, an Internet-based server, another wireless radio, and/or another wired connection.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the controller may include other functionality. For example, the controller IC may include an audio coder/decoder (CODEC) along with circuitry for performing the functions described herein. Such an IC is one example of an audio controller.

Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The described methods are generally set forth in a logical flow of steps. As such, the described order and labeled steps of representative figures are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although ones (1s) and zeros (0s) or highs and lows are given as example bit values throughout the description, the function of ones and zeros may be reversed without change in operation of the processor described in embodiments above. As another example, where general purpose processors are described as implementing certain processing steps, the general purpose processor may be a digital signal processors (DSPs), a graphics processing units (GPUs), a central processing units (CPUs), or other configurable logic circuitry. As a further example, although processing of audio data is described, other data may be processed through the filters and other circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
receiving a single-bit audio stream; and
converting the received single-bit audio stream into a converted single-bit audio stream having equivalent audio content as the received single-bit audio stream with a constant edge rate and a modulation index that is equal to the modulation index of the received single-bit audio stream scaled by a desired volume level.

2. The method of claim 1, wherein the step of converting comprises generating the converted single-bit audio stream without consecutive full-scale symbols.

3. The method of claim 1, wherein the step of converting comprises generating equivalent audio content by using multiple representations of a particular quantization symbol, wherein the multiple representations are alternatively encoded in the converted single-bit audio stream.

4. The method of claim 1, wherein the step of converting comprises modifying an input modulation index of the received single-bit audio stream.

5. The method of claim 1, wherein the step of converting comprises selecting symbols for the converted single-bit audio stream based, at least in part, on a desired volume level.

6. The method of claim 1, further comprising outputting the converted single-bit audio stream to a current-steering digital-to-analog converter (DAC) to reproduce the audio content using a transducer.

7. The method of claim 1, wherein the step of converting is performed, in part, by a poly-phase filter bank scheme.

8. The method of claim 1, wherein the step of converting is performed, in part, by a magnitude compensation filter.

9. An apparatus, comprising:
an audio controller configured to perform steps comprising:
receiving a single-bit audio stream; and
converting the received single-bit audio stream into a converted single-bit audio stream having equivalent audio content as the received single-bit audio stream with a constant edge rate and a selected modulation index that is equal to the modulation index of the received single-bit audio stream scaled by a desired volume level.

10. The apparatus of claim 9, wherein the audio controller is configured to convert by generating the converted single-bit audio stream without consecutive full-scale symbols.

11. The apparatus of claim 9, wherein the audio controller is configured to convert by generating equivalent audio content by using multiple representations of a particular quantization symbol, wherein the multiple representations are alternatively encoded in the converted single-bit audio stream.

12. The apparatus of claim 9, wherein the audio controller is configured to convert by selecting symbols for the converted single-bit audio stream based, at least in part, on a desired volume level.

13. The apparatus of claim 9, wherein the apparatus further comprises a current-steering digital-to-analog converter (DAC) to reproduce the audio content using a transducer based on the converted single-bit audio stream.

14. The apparatus of claim 9, wherein the audio controller comprises a poly-phase filter bank, and wherein the audio controller is configured to convert by using the poly-phase filter bank.

* * * * *